(12) United States Patent
Ostertun et al.

(10) Patent No.: US 8,284,608 B2
(45) Date of Patent: Oct. 9, 2012

(54) COMBINED EEPROM/FLASH NON-VOLATILE MEMORY CIRCUIT

(75) Inventors: Sönke Ostertun, Wedel (DE); Christoph Hans Joachim Garbe, Neu Wulmstorf (DE); Andreas Nentwig, Hamburg (DE); Nils Sandersfeld, Stade (DE)

(73) Assignee: NXP B.V., Eindhoven (NL)

( * ) Notice: Subject to any disclaimer, the term of this patent is extended or adjusted under 35 U.S.C. 154(b) by 84 days.

(21) Appl. No.: 12/898,183

(22) Filed: Oct. 5, 2010

(65) Prior Publication Data

US 2012/0081966 A1   Apr. 5, 2012

(51) Int. Cl.
*G11C 11/34* (2006.01)
(52) U.S. Cl. .......... 365/185.18; 365/185.23; 365/185.12
(58) Field of Classification Search ............. 365/185.18, 365/185.23, 185.12
See application file for complete search history.

(56) References Cited

U.S. PATENT DOCUMENTS

| | | | |
|---|---|---|---|
| 7,031,195 B2 * | 4/2006 | Sato et al. ................ 365/185.23 |
| 7,397,686 B2 * | 7/2008 | Takashima et al. ........... 365/145 |
| 7,492,639 B2 | 2/2009 | La Rosa | |
| 7,633,829 B2 * | 12/2009 | Fasoli et al. .............. 365/230.06 |
| 2004/0027856 A1 | 2/2004 | Lee et al. | |

\* cited by examiner

*Primary Examiner* — Son Dinh
*Assistant Examiner* — Nam Nguyen

(57) ABSTRACT

A non-volatile memory circuit includes memory rows and supporting circuits coupled to the memory rows, where at least one of the memory rows include at least one Electrically Erasable Programmable Read-Only Memory (EEPROM) memory element and at least one Flash memory element. The EEPROM and Flash elements are configured to share some of the supporting circuits and can be accessed in parallel.

20 Claims, 4 Drawing Sheets

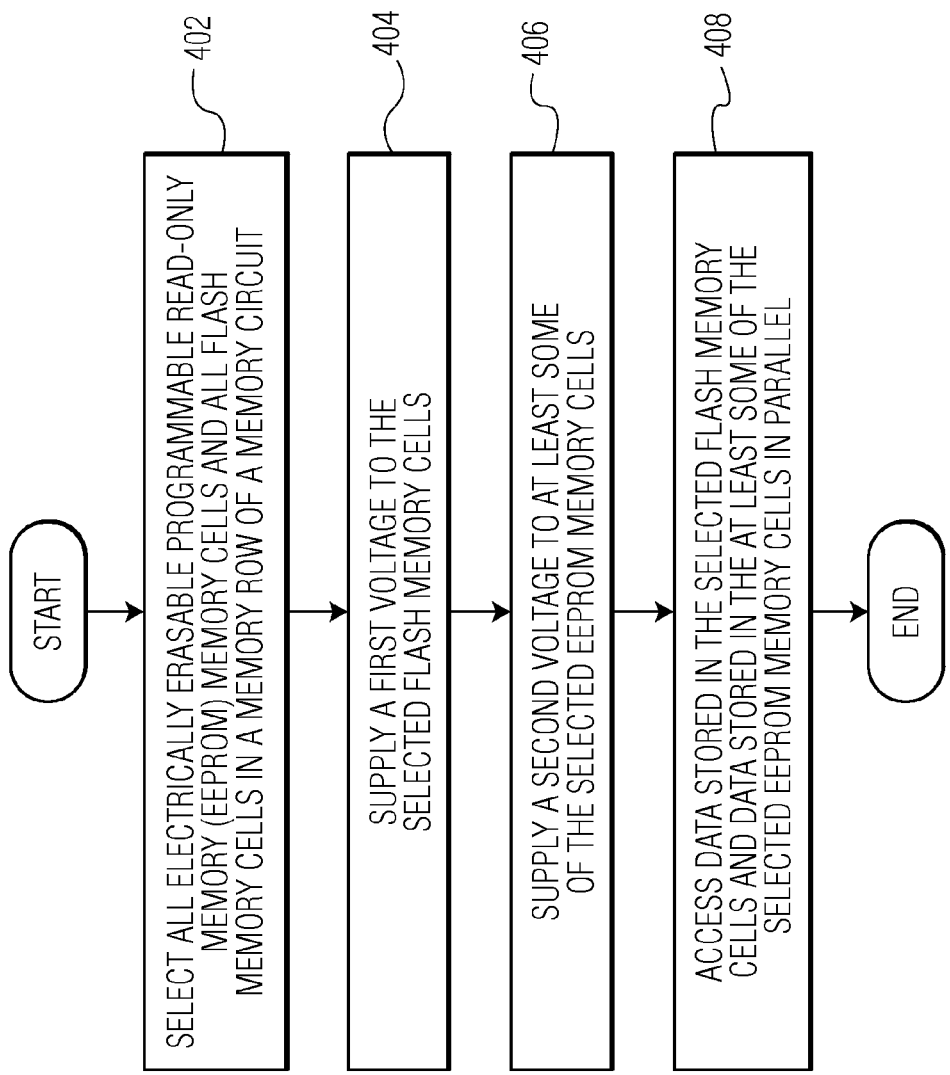

COMBINED EEPROM/FLASH NON-VOLATILE MEMORY CIRCUIT

Embodiments of the invention relate generally to electronic systems and methods and, more particularly, to memory circuits and methods for accessing memory circuits.

A non-volatile memory circuit stores data and retains the stored data when the non-volatile memory circuit even when not powered. Data stored in the non-volatile memory circuit generally includes data that needs to be accessed in a relatively small unit basis and data that only needs to be accessed in a relatively large unit basis. However, the data that needs to be accessed in a relatively small unit basis usually occupies more chip area than the data that only needs to be accessed in a relatively large unit basis. Therefore, there is a need to provide a memory circuit and method for operating the memory circuit that can accommodate both the data that needs to be accessed in a relatively small unit basis and the data that only needs to be accessed in a relatively large unit basis using reduced chip area.

A non-volatile memory circuit includes memory rows and supporting circuits, wherein at least one of the memory rows include at least one Electrically Erasable Programmable Read-Only Memory (EEPROM) memory element and at least one Flash memory element. The EEPROM and Flash elements are configured to share some of the supporting circuits and can be accessed in parallel.

In an embodiment, a non-volatile memory circuit includes memory rows and supporting circuits coupled to the memory rows, where at least one of the memory rows includes at least one EEPROM memory element and at least one Flash memory element. The at least one EEPROM element and the at least one Flash element are configured to be accessed in parallel. Some of the supporting circuits are shared by the at least one EEPROM element and the at least one Flash element of the at least one of the memory rows.

In an embodiment, a non-volatile memory circuit includes an EEPROM memory matrix, a Flash memory matrix, an address bus configured to receive a memory address, a column decoder coupled to the address bus and configured to select at which memory column a memory element that corresponds to the memory address is located, and a row decoder coupled to the address bus and configured to select at which memory row the memory element that corresponds to the memory address is located. At least one row of the non-volatile memory circuit includes at least one EEPROM memory element from the EEPROM memory matrix and at least one Flash memory element from the Flash memory matrix. The at least one EEPROM memory element and the at least one Flash memory element from the Flash memory matrix are configured to be accessed in parallel.

In an embodiment, a method for accessing data stored in a non-volatile memory circuit involves selecting all EEPROM memory cells and all Flash memory cells in a memory row of a memory circuit, supplying a first voltage to the selected Flash memory cells, supplying a second voltage to at least some of the selected EEPROM memory cells, and accessing data stored in the selected Flash memory cells and data stored in the at least some of the selected EEPROM memory cells.

Other aspects and advantages of embodiments of the present invention will become apparent from the following detailed description, taken in conjunction with the accompanying drawings, depicted by way of example of the principles of the invention.

FIG. 4 is a process flow diagram of a method for accessing data stored in a non-volatile memory circuit in accordance with an embodiment of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
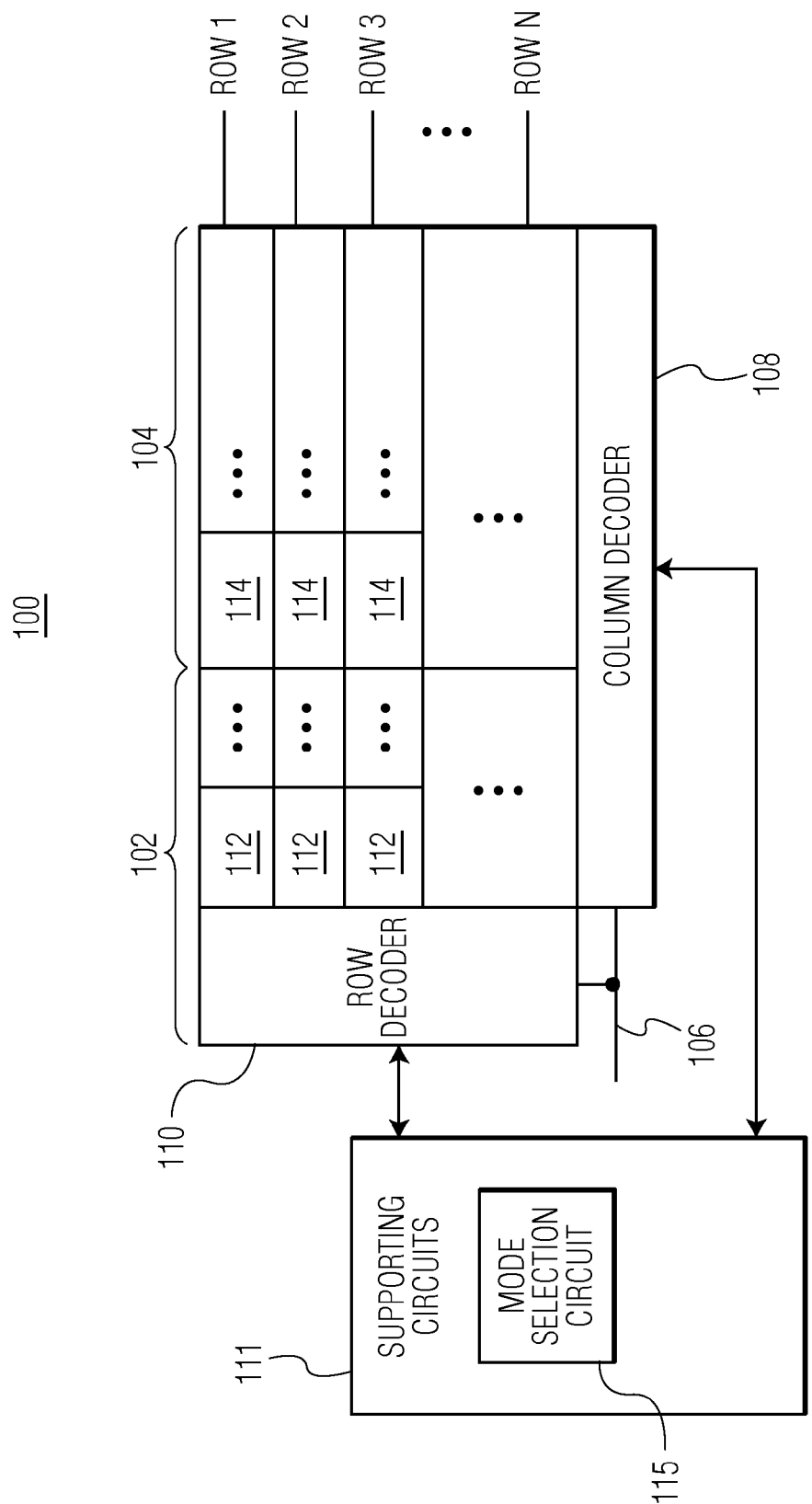
FIG. 1 shows a schematic block diagram of a non-volatile memory circuit in accordance with an embodiment of the invention.

FIG. 1 shows a schematic block diagram of a non-volatile memory circuit 100 in accordance with an embodiment of the invention. The non-volatile memory circuit is configured to store data and to retain the stored data when the non-volatile memory circuit is powered as well as not powered. The non-volatile memory circuit includes memory elements such as memory cells. Accessing data stored in a memory element of the non-volatile memory circuit may include reading the data stored in the memory element, erasing the data stored in the memory element, and/or writing new data into the memory element. The non-volatile memory circuit may be a standalone circuit or embedded within an integrated circuit (IC) such as a smartcard chip.

In the embodiment depicted in FIG. 1, the non-volatile memory circuit 100 includes an EEPROM memory matrix 102, a Flash memory matrix 104, an address bus 106, a column decoder 108, a row decoder 110 and support circuits 111 for the EEPROM memory matrix and the Flash memory matrix. Although the non-volatile memory circuit is depicted and described with certain components and functionality, other embodiments of the non-volatile memory circuit may include fewer or more components to implement less or more functionality.

The EEPROM memory matrix 102 of the non-volatile memory circuit 100 is configured to store data that requires a small granularity and to retain the stored data when the EEPROM memory matrix is powered as well as not powered. The data that requires a small granularity is data that needs to be accessed in a relatively small unit basis, for example, in an individual byte, in multiple bytes or in an individual word. The data that requires a small granularity will be referred to herein as the "small granularity data." In an embodiment, the small granularity data is application data that can be accessed in an individual word. The application data may include software variables such as counters, pointers and flags. In the embodiment depicted in FIG. 1, the EEPROM memory matrix includes at least one EEPROM memory cell 112, where each EEPROM memory cell includes at least one transistor.

The Flash memory matrix 104 of the non-volatile memory circuit 100 is configured to store data that does not require a small granularity and to retain the stored data when the Flash memory matrix is powered as well as not powered. Data that does not require a small granularity is data that only needs to be accessed in a relatively large unit basis. Data that does not require a small granularity does not need to be accessed in a relatively small unit basis, for example, in an individual byte, in multiple bytes or in an individual word. The data that does not require a small granularity will be referred to herein as the "large granularity data." In an embodiment, the large granularity data is software code that is usually written in large memory blocks and needs not be erased or changed in a small memory block. In the embodiment depicted in FIG. 1, the Flash memory matrix includes at least one Flash memory cell 114, where each Flash memory cell includes at least one transistor.

A major difference between the EEPROM memory matrix 102 and the Flash memory matrix 104 is that the memory EEPROM matrix requires a selection device for selecting a small memory unit to be accessed while the Flash memory matrix does not requires the selection device for selecting the small memory unit to be accessed. The selection device and the circuit to operate the selection device occupy a significant amount of area on a semiconductor chip on which the non-volatile memory circuit is manufactured. As a result, the EEPROM memory matrix occupies more chip area than the Flash memory matrix. Because the EEPROM memory matrix occupies more chip area per bit than the Flash memory matrix, material cost and manufacturing cost of the EEPROM memory matrix is higher than the Flash memory matrix.

Many supporting circuits of the EEPROM memory matrix and the Flash memory matrix are identical circuits or very similar circuits. For example, both the EEPROM memory matrix and the Flash memory matrix require supporting circuits such as charge pumps, sense amplifiers, decoders, mode logic circuits, power supply circuits, voltage regulators and/or voltage references. In the embodiment of FIG. 1, the non-volatile memory circuit 100 includes supporting circuits 111 that are shared between the EEPROM memory matrix 102 and the Flash memory matrix 104. In some embodiments, the supporting circuits includes at least one charge pump, at least one sense amplifier configured to measure a voltage or a current of at least one EEPROM element or at least one Flash element of the non-volatile memory circuit, mode logic circuits, power supply circuits configured to provide power to at least one EEPROM element and at least one Flash element of the non-volatile memory circuit, voltage regulators and/or voltage references. By sharing the supporting circuits between the EEPROM memory matrix and the Flash memory matrix, each of the EEPROM memory matrix and the Flash memory matrix does not need a separate set of supporting circuits. Compared to having two separate sets of supporting circuits for the EEPROM memory matrix and the Flash memory matrix, sharing at least some of the supporting circuits between the EEPROM memory matrix and the Flash memory matrix can bring significant saving with respect to chip area usage.

The supporting circuits 111 depicted in FIG. 1 may include a mode selection circuit 115 that is configured to generate a single signal to select either the EEPROM memory matrix 102 or the Flash memory matrix 104 or to generate two signals to select the EEPROM memory matrix, the Flash memory matrix or both in parallel. In some embodiment, the mode selection circuit is an external circuit such as a digital memory interface or a memory management unit. The supporting circuits interact with the column decoder 108 and the row decoder 110. Although the supporting circuits are shown in FIG. 1 as being located at the bottom left corner of the non-volatile memory circuit 100, the supporting circuits may be located in different locations in other embodiments.

Using only the EEPROM memory matrix 102 for both the small granularity data and the large granularity data increases the total chip area of the non-volatile memory circuit 100 and leads to a higher production cost.

Using only the Flash memory matrix 104 for both the small granularity data and the large granularity data can eliminate the need for the EEPROM memory matrix 102 and save the total chip area of the non-volatile memory circuit 100 and reduce the production cost. However, for the portion of the Flash memory matrix that stores the small granularity data, there is still need to be accessed in a relatively small memory unit basis. To access a small memory unit of the Flash memory matrix, an EEPROM emulation that requires an interim storage possibility and reduce the maximum erase/program cycles is necessary. Additionally, a read-modify-write operation that impacts on performance, power, and backup-management is required. If the read-modify-write operation is interrupted, the data stored in an entire row of the Flash memory matrix will be invalid. For the read-modify-write operation, a backup-management program for an interrupted erase-program cycle must be extended to all data stored in the entire row of the Flash memory matrix, which includes data that is not subject of change. However, the backup-management program, especially the ones in security relevant circuits such as banking cards, needs to store flags that indicate the backup progress in the Flash memory matrix in case of a power-off interruption. Because the flags that indicate the backup progress must work without additional backup management, these flags have to cover at least one complete memory row. As a result, additional memory space is required.

Combining the EEPROM memory matrix 102 and the Flash memory matrix 104 into to the non-volatile memory circuit 100 without sharing the supporting circuits 111 between the EEPROM memory matrix and the Flash memory matrix requires separate supporting circuits for each of the EEPROM memory matrix and the Flash memory matrix. As a result, the double-placement of all the identical or similar supporting circuits increases the total required chip area. In addition, the doubled routing of address and data busses can increase the total overhead.

Combining the EEPROM memory matrix 102 and the Flash memory matrix 104 into to the non-volatile memory circuit 100 and sharing the supporting circuits 111 between the EEPROM memory matrix and the Flash memory matrix brings in the benefit of smaller granularity achieved by the EEPROM memory matrix along with the benefit of the smaller chip area achieved by the Flash memory matrix in a single electronic device.

When manufactured under the same technology, the memory cell 112 of the EEPROM memory matrix 102 is identical with or similar to the memory cell 114 of the Flash memory matrix 104. Compared to the memory cell of the Flash memory matrix, the memory cell of the EEPROM memory matrix needs an additional selection element. As a result, an additional well may be required for groups of transistors of the memory cell of the EEPROM memory matrix and the selection element. In an embodiment, transistors of the memory cell of the EEPROM memory matrix and transistors of the selection element may be of different types and require bulk materials in different doping types. For example, the transistors of the memory cell of the EEPROM memory matrix are pmos transistors that need an n-doped bulk material while the transistors of the selection element are nmos transistors that need a p-doped bulk material. Because of the additional elements for the EEPROM memory matrix, one row of the EEPROM memory matrix is significantly longer when fabricated in a semiconductor chip than one row of the Flash memory matrix for storing an identical amount of data. Because of the different lengths of the rows, a combination of the EEPROM memory matrix and the Flash memory matrix in which some memory rows form the EEPROM memory matrix and some other memory rows form the Flash memory matrix is practically not feasible. In an embodiment, the difference in lengths of Flash and EEPROM memory rows is significant enough such that sharing bitlines is not feasible. For example, the EEPROM memory row may need a bitline at every 1.0 µm while the Flash memory row may need a bitline at every 0.8 µm. Because of the different bitline spacing, the spreading of the metal connections adds a large routing overhead and therefore is not feasible when hundreds of bitlines are to be connected.

In the embodiment depicted in FIG. 1, the non-volatile memory circuit 100 includes N rows of memory elements, where N is an integer that is larger than three. Memory elements in each memory row are configured to be accessed in parallel. Each memory row of the non-volatile memory circuit includes at least one EEPROM memory cell 112 and at least one Flash memory cell 114. Although the non-volatile memory circuit is shown in FIG. 1 as including more than three rows of memory elements, other embodiments of the non-volatile memory circuit may include exactly three rows of memory elements or less than three rows of memory elements. The structure of an EEPROM memory cell is similar to or identical with the structure of a Flash memory cell. The electrical operation of an EEPROM memory cell is also similar to or identical with the electrical operation of a Flash memory cell. By including the EEPROM memory cell and the Flash memory cell in each row of the non-volatile memory circuit, common supporting circuits such as charge pumps, sense amplifiers, decoders, mode logic circuits, power supply circuits, voltage regulators and/or voltage references can be shared between the EEPROM memory matrix and the Flash memory matrix. Additionally, by including the EEPROM memory cell and the Flash memory cell in each row of the non-volatile memory circuit, a uniform length can be achieved for each memory row of the non-volatile memory circuit. In the embodiment depicted in FIG. 1, the heights or widths of the memory rows are identical with each other to allow a proper layout.

In some embodiments, a memory column of the non-volatile memory circuit 100 includes at least one EEPROM memory element and at least one Flash memory element. However, compared to having at least one EEPROM memory element and at least one Flash memory element in a memory row, having at least one EEPROM memory element and at least one Flash memory element in a memory column is unlikely in industry practices. One of the reasons why it is unlikely in industry practices is that heights of the EEPROM and Flash memory elements for storing same amount of data are similar to each other while lengths of the EEPROM and Flash memory elements for storing same amount of data differ significantly. Because the heights of the EEPROM and Flash memory elements for storing same amount of data are similar to each other, placing the EEPROM and Flash memory elements in a memory row can be done easily. Because the lengths of the EEPROM and Flash memory elements for storing same amount of data differ significantly, placing the EEPROM and Flash memory elements in a memory column can lead to problems in the column structure of the non-volatile memory circuit. The problems in the column structure of the non-volatile memory circuit can increase layout constraints of the non-volatile memory circuit. In addition, the additional EEPROM memory selection possibility requires additional signals served from the column decoder 108 to the EEPROM memory element. Compared to implementing the EEPROM memory element and the Flash memory element in a memory column, modifying the column decoder to serve the additional signals is easier when the EEPROM memory element and the Flash memory element are implemented in a memory row.

The address bus 106 of the non-volatile memory circuit 100 is used to receive an input memory address and to transmit the received memory address to the column decoder 108 and the row decoder 110 for address decoding.

The column decoder 108 of the non-volatile memory circuit 100 is configured to select at which memory column a memory element that corresponds to the input memory address is located. The memory element may be used to store a bit, a word, or another amount of data. In the embodiment depicted in FIG. 1, the column decoder is located below the EEPROM memory matrix 102 and the Flash memory matrix 104.

The row decoder 110 of the non-volatile memory circuit 100 is configured to select at which memory row a memory element that corresponds to the input memory address is located. In the embodiment depicted in FIG. 1, the row decoder is located to the left of the EEPROM memory matrix 102 and the Flash memory matrix 104.

In some embodiments, the memory element is configured to store a data word. A memory row of the non-volatile memory circuit 100 generally contains a certain number of EEPROM element/elements and a different number of Flash element/elements. For example, the number of the EEPROM element/elements in a memory row may be equal to $2^e$ and the number of the Flash element/elements in the memory row may be equal to $2^f$, where e and f are different non-negative integers. In this case, the number of needed address bits for the column decoder is equal to the higher value of the integer e and the integer f. One of the reason why the number of needed address bits for the column decoder is equal to the higher value of the integers e and f is that the column address bits are usually less significant than the row address bits to keep memory blocks of the EEPROM memory matrix 102 and the Flash memory matrix 104, which are accessible in parallel, at a continuous address space. In an example, the non-volatile memory circuit includes 1024 memory rows and each memory row stores 128 data words. In this case, the addresses of memory elements in the first row may be 0, 1024, 2048, ..., 130,048 while the address of memory elements in the second row may be 1, 1025, 2049, ..., 130,049 if the row address is less significant than the column address. As a result, memory elements in a memory row cannot be easily accessed in parallel. However, if the column address is less significant than the row address, memory elements in a memory row may have continuous address such as 0, ..., 127 and as a result can be easily accessed in parallel. Because the column address bits are usually less significant than the row address bits, some of the address bits are not relevant for the EEPROM memory matrix when e<f or not relevant for the Flash memory matrix when f<e.

Figure 2:
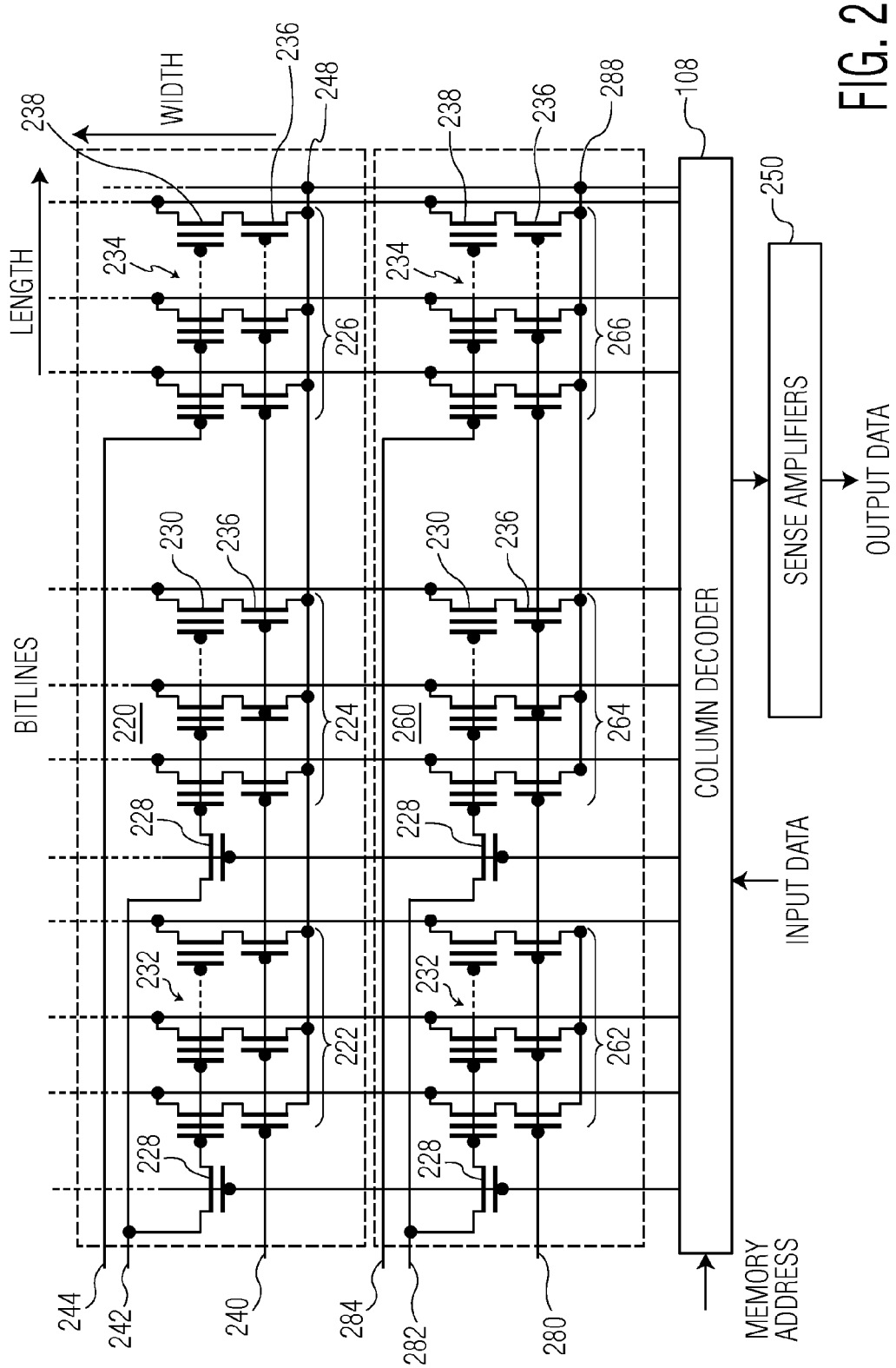
FIG. 2 depicts an embodiment of two memory rows in the non-volatile memory circuit depicted in FIG. 1.

FIG. 2 depicts an embodiment of two memory rows 220, 260 in the non-volatile memory circuit 100 depicted in FIG. 1. The memory row 220 includes two EEPROM memory elements 222, 224, one Flash memory element 226 and two selection transistors 228 coupled to the two EEPROM memory elements 222, 224. The memory row 260 includes two EEPROM memory elements 262, 264, one Flash element 266 and two selection transistors 228 coupled to the two EEPROM memory elements 262, 264. Each of the EEPROM memory elements is configured to store a data word and includes multiple EEPROM memory cells 232. Each of the EEPROM memory cells includes an EEPROM cell transistor 230 and an access transistor 236. Each of the Flash memory elements is configured to store another data word and includes multiple Flash memory cells 234. Each of the Flash memory cells includes a Flash cell transistor 238, which may be similar to or identical with an EEPROM cell transistor, and an access transistor 236. The access transistors are configured to select each EEPROM cell transistor and each Flash cell transistor of the memory row when a common access voltage supply line 240 or 280 is activated. Each of the EEPROM memory elements is connected to an EEPROM memory voltage supply line 242 or 282 through the selection transistor 228. In the embodiment depicted in FIG. 2, the selection transistor is controlled by the column decoder 108. By controlling the selection transistors, for example, by activating or deactivating the selection transistors, each of the EEPROM elements can be connect to or separated from the EEPROM memory voltage supply line. In an embodiment, each of the selection transistors is configured to be activated to connect one of the EEPROM voltage supply lines 242, 282 to one of the EEPROM memory elements and to be deactivated to separate one of the EEPROM memory voltage supply lines from one of the EEPROM memory elements. Each of the Flash memory elements is connected to one of the Flash memory voltage supply lines 244, 284 without any selection transistor and is configured to be accessible when the Flash memory voltage supply line is activated. In the embodiment depicted in FIG. 2, the common access voltage supply lines, the EEPROM memory voltage supply lines and the Flash memory voltage supply lines are coupled to gates of the access transistors, the EEPROM cell transistors, and the Flash cell transistors, respectively.

The Flash memory voltage supply lines 244, 284 are separated from the EEPROM memory voltage supply lines 242, 284. In other words, each of the horizontally memory rows 220, 260 includes memory cells 232 in memory element selection possibility for the EEPROM functionality and additional memory cells 234 without additional selection possibility to reach the high bit density for the Flash area. By using appropriate voltages at the EEPROM memory voltage supply lines and the Flash memory voltage supply lines, selected EEPROM memory cells and/or the Flash memory cells can be accessed separately or simultaneously. In the embodiment depicted in FIG. 2, the EEPROM memory voltage supply lines, the Flash memory voltage supply lines, and the common access voltage supply lines are controlled by the row decoder 110 (not shown in FIG. 2). The column decoder 108 controls the selection transistors 228 to select the desired EEPROM memory element.

In the embodiment depicted in FIG. 2, lines extending from the top of each of the cell transistors 230, 238 are common for all of the memory rows 220, 260 and individual bit column, and are referred to as "bitlines." Vertical lines that are connected to the gate of the selection transistors 228 are common for all of the memory rows and individual word column, and are referred to as "word selection lines." Lines 248, 288 extending under the access transistors 236 are connected to each other and, are referred as global connection lines. In an embodiment, the global connection lines are connected to ground. In the embodiment depicted in FIG. 2, accessing the data stored in the cell transistor 230, 238 is done by forcing a current or a voltage to a corresponding bitline at the corresponding column address of the cell transistor, connecting the corresponding bitline to the sense amplifiers 250, and measuring the voltage or the current of the bitline at the sense amplifiers. Accessing the data stored in one of the memory rows 220, 260 is done by forcing appropriate voltages to the access voltage supply lines 240, 280, respectively, to generate output data. In FIG. 2, input data is data that is input into the memory rows 220, 260 for storage.

The number of voltage supply lines 242, 244, 282, 284 for the EEPROM memory elements 222, 224, 262, 264 and the Flash element 226, 266 for each of the memory rows 220, 260 affects the routing in the layout of the non-volatile memory circuit 100. Because of the routing limitations in the layout of the non-volatile memory circuit, more than very few voltage supply lines per row for supplying the EEPROM/Flash memory elements are not feasible. For example, each voltage supply line may require the row decoder 110 to provide a separate driver circuit.

Although each of the EEPROM memory elements 222, 224, 262, 264 is shown in FIG. 2 as including more than three EEPROM memory cells 232, other embodiments of the EEPROM memory element may include exactly three EEPROM memory cells or less than three EEPROM memory cells. Similarly, although each of the Flash memory elements 226, 266 is shown in FIG. 2 as including more than three Flash memory cells 234, other embodiments of the Flash memory element may include exactly three Flash memory cells or less than three Flash memory cells. Additionally, although each of the EEPROM memory cells and the Flash memory cell in each memory row includes the access transistor in the embodiment depicted in FIG. 2, the EEPROM memory cell and/or the Flash memory cell may not include an access transistor in other embodiments. Furthermore, although each of the EEPROM memory element and the Flash memory element stores one data word in the embodiment depicted in FIG. 2, other embodiments of the EEPROM memory element and the Flash memory element may store more or less than one data word.

In the embodiment depicted in FIG. 2, each of the memory rows 220, 260 includes two EEPROM memory elements 222, 224, 262, 264 and one Flash element 226, 266. However, other embodiments of the memory row may include a different number of EEPROM memory element/elements and a different number of Flash element/elements. When the memory row includes only one EEPROM memory element, the selection transistor 228 and the corresponding circuit for controlling the circuitry to control the selection transistor can be omitted. Including only one EEPROM memory element in a memory row is in alignment with the need of products of having a large memory space for software code and a much smaller space for application data. Instead of having one Flash element in each memory row, one memory row can include more than one Flash element. In this case, a Flash memory matrix with a smaller granularity can be developed without losing the possibility of programming the full row simultaneously.

Figure 3:
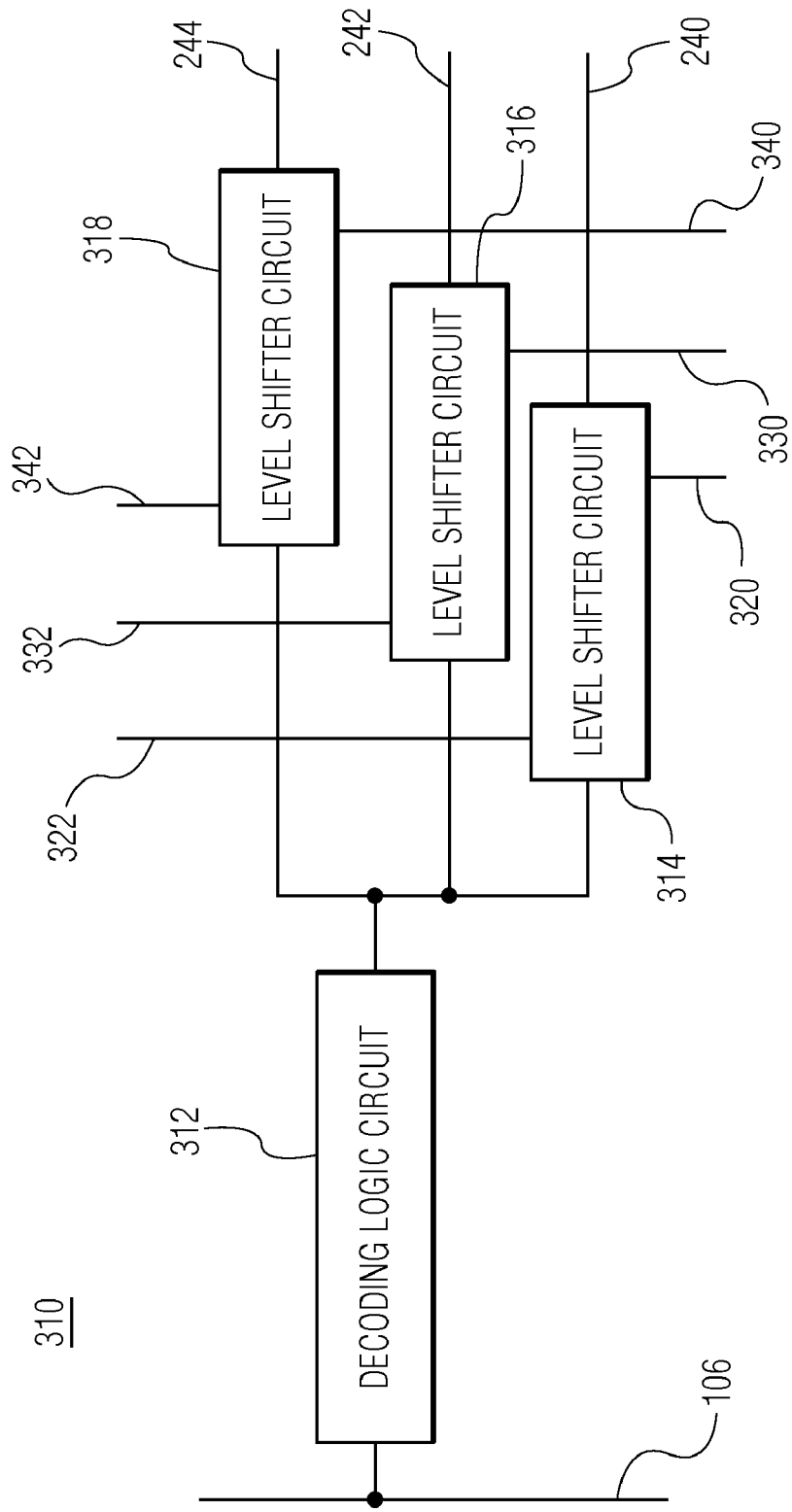
FIG. 3 depicts an embodiment of the row decoder depicted in FIG. 1 for a single memory row.

FIG. 3 depicts an embodiment of the row decoder 110 depicted in FIG. 1 for a single memory row, e.g., the memory row 220. The row decoder 310 includes a standard decoding logic circuit 312, a level shifter circuit 314 for the common access voltage supply, a level shifter circuit 316 for the EEPROM memory voltage supply, and a level shifter circuit 318 for the Flash memory voltage supply. The standard decoding logic circuit is connected to the address bus 106 and is configured to deliver a selection state to the three level shifters. The level shifter circuit 314 is configured to provide a common voltage supply signal for the access transistors 236 via the line 240. The level shifter circuit 316 is configured to provide a voltage supply signal for the EEPROM cell transistors 230 via the line 242. The level shifter circuit 318 is configured to provide a voltage supply signal for the Flash cell transistors 238 via the line 244. The three level shifter circuits are connected to global negative voltage supply lines 320, 330, and 340, respectively to receive negative voltage supply. The three level shifter circuits are also connected to global positive voltage supply lines 322, 332, and 342, respectively to receive positive voltage supply. Positive and negative voltage supplies mean higher voltage supplies and lower voltage supplies, which correspond to "selected" and "unselected" states for the level shifter circuits. The selection of EEPROM and/or Flash elements in a memory row of the non-volatile memory circuit 100 can be done by applying appropriate global supply voltages to the level shifter circuits 314, 316, 318.

FIG. 4 is a process flow diagram of a method for accessing data stored in a non-volatile memory circuit in accordance with an embodiment of the invention. At block 402, all EEPROM memory cells and all Flash memory cells in a memory row of a memory circuit are selected. At block 404, a first voltage is supplied to the selected Flash memory cells. At block 406, a second voltage is supplied to at least some of the selected EEPROM memory cells. At block 408, data stored in the selected Flash memory cells and data stored in the at least some of the selected EEPROM memory cells are accessed in parallel.

Embodiments of the invention can be used for electronic circuits using non-volatile embedded memories with the need of a large memory for block-type data and a small memory for data with individual erase/program access to combine the small granularity achieved by the EEPROM memory with the high effective overall bit-density achieved by the Flash memory.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A non-volatile memory circuit, the non-volatile memory circuit comprising:
   memory rows, wherein at least one of the memory rows comprises at least one Electrically Erasable Programmable Read-Only Memory (EEPROM) memory element and at least one Flash memory element, and wherein the at least one EEPROM element and the at least one Flash element are configured to be accessed in parallel; and
   supporting circuits coupled to the memory rows, wherein some of the supporting circuits are shared by the at least one EEPROM element and the at least one Flash element of the at least one of the memory rows.

2. The non-volatile memory circuit of claim 1, wherein each of the at least one EEPROM memory element comprises one or more EEPROM memory cells, wherein each of the at least one Flash element comprises one or more Flash memory cells, wherein each of the one or more EEPROM memory cells comprises an EEPROM cell transistor, and wherein each of the one or more Flash memory cells comprises a Flash cell transistor, wherein each of the memory rows comprises the at least one EEPROM memory element and the at least one Flash memory element, and wherein the heights of the memory rows are identical to each other.

3. The non-volatile memory circuit of claim 2, wherein each of the at least one EEPROM memory element is configured to store a data word, and wherein each of the at least one Flash element is configured to store another data word.

4. The non-volatile memory circuit of claim 2, wherein each of the one or more EEPROM memory cells further comprises an access transistor, and wherein each of the one or more Flash memory cells further comprises another access transistor.

5. The non-volatile memory circuit of claim 4, wherein the access transistors are coupled to a voltage supply line and are configured to select each EEPROM cell transistor and each Flash cell transistor of the memory row when the voltage supply line is activated.

6. The non-volatile memory circuit of claim 5, wherein the at least one of the memory rows further comprises selection transistors, and wherein each of the selection transistors is coupled to a second voltage supply line and to one of the EEPROM memory elements.

7. The non-volatile memory circuit of claim 6, wherein the selection transistors are configured to be activated to connect the second voltage supply line to one of the EEPROM memory elements and to be deactivated to separate the second voltage supply line from one of the EEPROM memory elements.

8. The non-volatile memory circuit of claim 7, wherein the Flash cell transistors of the Flash memory cells are coupled to a third voltage supply line and are configured to be accessible when the third voltage supply line is activated.

9. The non-volatile memory circuit of claim 2, wherein the at least one of the memory rows comprises only one EEPROM memory element.

10. The non-volatile memory circuit of claim 1, wherein the supporting circuits comprise a sense amplifier configured to measure a voltage or a current of the at least one EEPROM element or the at least one Flash element, a mode selection circuit configured to generate a signal to select the at least one EEPROM element, the at least one Flash element, or the at least one EEPROM element and the at least one Flash element in parallel, and power supply circuits configured to provide power to the at least one EEPROM element and the at least one Flash element.

11. The non-volatile memory circuit of claim 1 further comprising:
an address bus configured to receive a memory address;
a column decoder coupled to the address bus and configured to select at which memory column an EEPROM memory element or a Flash memory element that corresponds to the memory address is located; and
a row decoder coupled to the address bus and configured to select at which memory row the EEPROM memory element or the Flash memory element that corresponds to the memory address is located.

12. A non-volatile memory circuit, the non-volatile memory circuit comprising:
an Electrically Erasable Programmable Read-Only Memory (EEPROM) memory matrix;
a Flash memory matrix;
an address bus configured to receive a memory address;
a column decoder coupled to the address bus and configured to select at which memory column a memory element that corresponds to the memory address is located; and
a row decoder coupled to the address bus and configured to select at which memory row the memory element that corresponds to the memory address is located,
wherein at least one row of the non-volatile memory circuit comprises at least one EEPROM memory element from the EEPROM memory matrix and at least one Flash memory element from the Flash memory matrix, and wherein the at least one EEPROM memory element and the at least one Flash memory element from the Flash memory matrix are configured to be accessed in parallel.

13. The non-volatile memory circuit of claim 12, wherein each of the at least one EEPROM memory element comprises one or more EEPROM memory cells, wherein each of the at least one Flash element comprises one or more Flash memory cells, wherein each of the one or more EEPROM memory cells comprises an EEPROM cell transistor, and wherein each of the one or more Flash memory cells comprises a Flash cell transistor, wherein each memory row of the non-volatile memory circuit comprises the at least one EEPROM memory element and the at least one Flash memory element, and wherein the heights of memory rows of the non-volatile memory circuit are identical to each other.

14. The non-volatile memory circuit of claim 13, wherein each of the one or more EEPROM memory cells further comprises an access transistor, wherein each of the one or more Flash memory cells further comprises another access transistor, wherein the access transistors are coupled to a voltage supply line and are configured to select each EEPROM cell transistor and each Flash cell transistor of the at least one memory row when the voltage supply line is activated, wherein the at least one memory row further comprises selection transistors, wherein each of the selection transistors is coupled to a second voltage supply line and to one of the EEPROM memory elements, wherein the selection transistors are configured to be activated to connect the second voltage supply line to one of the EEPROM memory elements and to be deactivated to separate the second voltage supply line from one of the EEPROM memory elements, and wherein the Flash cell transistors of the Flash memory cells are coupled to a third voltage supply line and are configured to be accessible when the third voltage supply line is activated.

15. The non-volatile memory circuit of claim 12, wherein each of the at least one EEPROM memory element is configured to store a data word, and wherein each of the at least one Flash element is configured to store another data word.

16. The non-volatile memory circuit of claim 12, wherein the at least one memory row comprises only one EEPROM memory element.

17. The non-volatile memory circuit of claim 12, wherein the row decoder comprises a decoding circuit and level shifter circuits for the at least one memory row.

18. The non-volatile memory circuit of claim 12 further comprising supporting circuits coupled to the EEPROM memory matrix and the Flash memory matrix, wherein some of the supporting circuits are shared by the at least one EEPROM element and the at least one Flash element of the at least one of the memory rows.

19. A method for accessing data stored in a non-volatile memory circuit, the method comprising:
selecting all Electrically Erasable Programmable Read-Only Memory (EEPROM) memory cells and all Flash memory cells in a memory row of a memory circuit;
supplying a first voltage to the selected Flash memory cells;
supplying a second voltage to at least some of the selected EEPROM memory cells; and
accessing data stored in the selected Flash memory cells and data stored in the at least some of the selected EEPROM memory cells.

20. The method of claim 19, wherein supplying the second voltage to the at least some of the selected EEPROM memory cells comprises supplying the second voltage to the selected EEPROM memory cells through selection transistors, wherein supplying the second voltage to the at least some of the selected EEPROM memory cells further comprises activating or deactivating the selection transistors, and wherein accessing data stored in the selected Flash memory cells and data stored in the at least some of the selected EEPROM memory cells comprises at least one of:
reading the data stored in the selected Flash memory cells and the data stored in the at least some of the selected EEPROM memory cells;
erasing the data stored in the selected Flash memory cells and the data stored in the at least some of the selected EEPROM memory cells; and
writing new data into the selected Flash memory cells and the at least some of the selected EEPROM memory cells,
wherein each memory row of the memory circuit comprises the EEPROM memory cells and the Flash memory cells, and wherein the heights of memory rows of the memory circuit are identical to each other.

* * * * *